(12) United States Patent
Hartzog (10) Patent No.: US 7,902,830 B2
(45) Date of Patent: Mar. 8, 2011

(54) SYSTEM TO MEASURE SERIES-CONNECTED CELL VOLTAGES USING A FLYING CAPACITOR

(75) Inventor: Chad Hartzog, Kokomo, IN (US)

(73) Assignee: EnerDel, Inc., Indianapolis, IN (US)

( * ) Notice: Subject to any disclaimer, the term of this patent is extended or adjusted under 35 U.S.C. 154(b) by 831 days.

(21) Appl. No.: 11/744,444

(22) Filed: May 4, 2007

(65) Prior Publication Data

US 2008/0272791 A1   Nov. 6, 2008

Related U.S. Application Data

(60) Provisional application No. 60/746,432, filed on May 4, 2006, provisional application No. 60/828,464, filed on Oct. 6, 2006, provisional application No. 60/828,457, filed on Oct. 6, 2006, provisional application No. 60/828,471, filed on Oct. 6, 2006.

(51) Int. Cl.
*G01N 27/416*   (2006.01)

(52) U.S. Cl. ........................... 324/434; 320/136; 320/166

(58) Field of Classification Search ................... 324/426, 324/434; 320/136, 166
See application file for complete search history.

(56) References Cited

U.S. PATENT DOCUMENTS

| | | |
|---|---|---|
| 5,808,469 A | 9/1998 | Kopera |
| 5,914,606 A | 6/1999 | Becker-Irvin |
| 5,955,869 A * | 9/1999 | Rathmann ............... 320/132 |
| 6,020,717 A | 2/2000 | Kadouchi et al. |
| 6,157,165 A | 12/2000 | Kinoshita et al. |
| 6,362,627 B1 | 3/2002 | Shimamoto et al. |
| 6,462,510 B1 * | 10/2002 | Takada et al. ............ 320/116 |
| 6,570,387 B2 | 5/2003 | Maki et al. |
| 6,646,442 B2 | 11/2003 | Katoh |
| 6,677,758 B2 | 1/2004 | Maki et al. |
| 6,803,766 B2 | 10/2004 | Kobayashi et al. |
| 7,071,698 B2 | 7/2006 | Furukawa et al. |
| 7,078,908 B2 | 7/2006 | Fujita et al. |
| 2005/0189949 A1 | 9/2005 | Shimizu et al. |
| 2005/0206364 A1 | 9/2005 | Ishikawa et al. |
| 2006/0103351 A1 * | 5/2006 | Tanigawa et al. ......... 320/118 |
| 2006/0132139 A1 | 6/2006 | Ohta et al. |

FOREIGN PATENT DOCUMENTS

| | | |
|---|---|---|
| JP | 2002286766 A | 10/2002 |
| JP | 2003240806 A | 8/2003 |
| JP | 2006078323 A | 3/2006 |
| JP | 2006292516 A | 10/2006 |

* cited by examiner

*Primary Examiner* — Edward Tso
*Assistant Examiner* — Aaron Piggush
(74) *Attorney, Agent, or Firm* — Ice Miller LLP (57) ABSTRACT

A system for measuring voltage of individual cells connected in series includes a single flying capacitor. The capacitor stores the charge of one of the cells such that an analog-to-digital converter (ADC) connected to the capacitor may process an accurate representation of the voltage of the cell being measured. A plurality of MOSFET-based switches electrically connects and disconnects the cells and the capacitor. A controller is in communication with the ADC and the switches for sequencing the switches and recording the voltage measurements of each cell.

14 Claims, 4 Drawing Sheets

SYSTEM TO MEASURE SERIES-CONNECTED CELL VOLTAGES USING A FLYING CAPACITOR

CROSS REFERENCE TO RELATED APPLICATIONS

This application claims the benefit of U.S. Provisional Application No. 60/746,432 filed May 4, 2006, U.S. Provisional Application No. 60/828,464 filed Oct. 6, 2006, U.S. Provisional Application No. 60/828,457 filed Oct. 6, 2006, and U.S. Provisional Application No. 60/828,471 filed Oct. 6, 2006, all of which are incorporated by reference.

BACKGROUND OF THE INVENTION

1. Field of the Invention

The subject invention relates to a system for determining a voltage in each cell of a plurality of battery cells connected in series.

2. Description of the Related Art

Electric vehicles and hybrid-electric vehicles typically utilize numerous cells (i.e., batteries) for powering electric drive motors and other electric equipment. These cells are often connected together in a series relationship, as is well known to those skilled in the art, to provide higher voltages.

Due to variations between individual cells, such series-connected cells require periodic balancing, i.e., charge equalization, to maintain a steady voltage and prevent premature failure. One difficulty in cell balancing is determining which cell or cells may need to individually charged or replaced. Therefore, it is necessary to provide a system to determine the voltage in each cell.

Numerous systems and techniques have been developed to address this necessity. One such system is disclosed in U.S. Pat. No. 5,914,606 (the '606 patent) to Becker-Irvin. The system disclosed in the '606 patent teaches each individual cell being directly connected to an amplifier through a bank of switches. A controller is also connected to the amplifier to measure the voltage of the selected cell. Unfortunately, the system of the '606 patent does not provide any isolation between the cells and the controller, resulting in a fluctuating voltage, especially when the cells are in use. Furthermore, the system of the '606 patent would require high precision resistor dividers to divide the voltage down to an acceptable level for measurement.

Other systems utilize one or more capacitors between the cells and the amplifier such that a more stable and accurate voltage may be measured. For instance, U.S. Pat. No. 6,362,627 (the '627 patent) to Shimamoto et al. discloses a system with a plurality of cell switches connected to various cells, a capacitor connected to the cell switches, and an amplifier connected to the capacitor. The '627 patent uses a secondary polarity correction, which would add to measurement error.

Japanese Patent Abstract Publication No. 2003240806 (the '806 publication) to Yazaki Corporation discloses a system for measuring voltage of individual cells in a plurality of cells connected in series. The system includes a plurality of cell switches electrically connected to the plurality of cells with one switch connected on each side of each cell. A first bus is electrically connected to the second side of every other cell switch and a second bus is electrically connected to the second side of each cell switch not connected to the first bus. A capacitor is electrically connected between the busses. Four bus switches are electrically connected to the capacitor and the busses: one pair of bus switches allow connection between either side of the capacitor and an amplifier, while another pair of bus switches allows connection between either side of the capacitor and ground. The system of the '806 publication may not accommodate an implementation with MOSFET-type transistors as switches, since some current must be drawn from the system in order to turn on the MOSFETs.

Despite the various systems described above and existing elsewhere in the prior art, there remains an opportunity for a system for measuring voltage of individual cells connected in series having improved accuracy, higher measurement speed, and lower implementation costs.

SUMMARY OF THE INVENTION AND ADVANTAGES

The invention provides a system for measuring voltage of individual cells in a plurality of cells connected in series. The system includes a plurality of cell switches for electrical connection to the plurality of cells. Each cell switch includes a first side and a second side with the first side of each cell switch electrically connectable to a positive terminal one of the cells. A first bus is electrically connected to the second side of every other cell switch and a second bus is electrically connected to the second side of each cell switch not connected to the first bus. A first bus positive switch has a first side and a second side with the first side electrically connected to the first bus. A second bus positive switch has a first side and a second side with the first side electrically connected to the second bus. A first bus negative switch has a first side and a second side with the first side electrically connected to the first bus. A second bus negative switch has a first side and a second side with the first side electrically connected to the second bus. The system also includes a capacitor for storing a charge of at least one of the cells. The capacitor includes a positive terminal electrically connected to the second sides of the first bus positive switch and the second bus positive switch and a negative terminal electrically connected to the second sides of the first bus negative switch and the second bus negative switch. The system further includes an amplifier for amplifying the charge stored on the capacitor. The amplifier includes an inverting input electrically connected to the negative terminal of the capacitor, a non-inverting input electrically connected to the positive terminal of the capacitor, and an output.

Utilization of the first and second busses connected to alternating cells allows for a single capacitor to be utilized for storing the charge of the cell being measured. Obviously, this greatly reduces system complexity and cost over prior art systems having multiple capacitors.

Furthermore, direct electrical connection of the capacitor to the amplifier, achieved by disposing the bus switches between the capacitor and the busses, provides further advantages. First, the capacitor can maintain a common polarity for each cell tested. That is, the positive terminal of the capacitor is always connected to the positive side of the cell being tested and the negative terminal of the capacitor is always connected to the negative side of the cell. This common polarity results in more consistent charging of the capacitor and doesn't require polarity correction after charging. Second, the use of solid state bus switches, such as field-effect transistors, may be utilized more effectively. Such transistors are subject to leakage current which could, if connected between the capacitor and the amplifier, affect a voltage reading of the output of the amplifier. Further, a small activation current is required from the bus to activate the transistors. However, by connecting the transistors, i.e., the bus switches, between the cells and the capacitor, such leakage and activation currents will have a minimal effect on a given voltage reading. Therefore, a more accurate voltage measurement may be made by the system of the subject invention.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate corresponding parts throughout the several views, a system 10 for measuring voltage of individual cells 12 in a plurality of cells connected in series is shown. Those skilled in the art realize that a "cell" is commonly referred to as a "battery". However, for purposes of consistency, the term cell 12 shall be used throughout and should not be regarded as limiting in any way.

Figure 1:
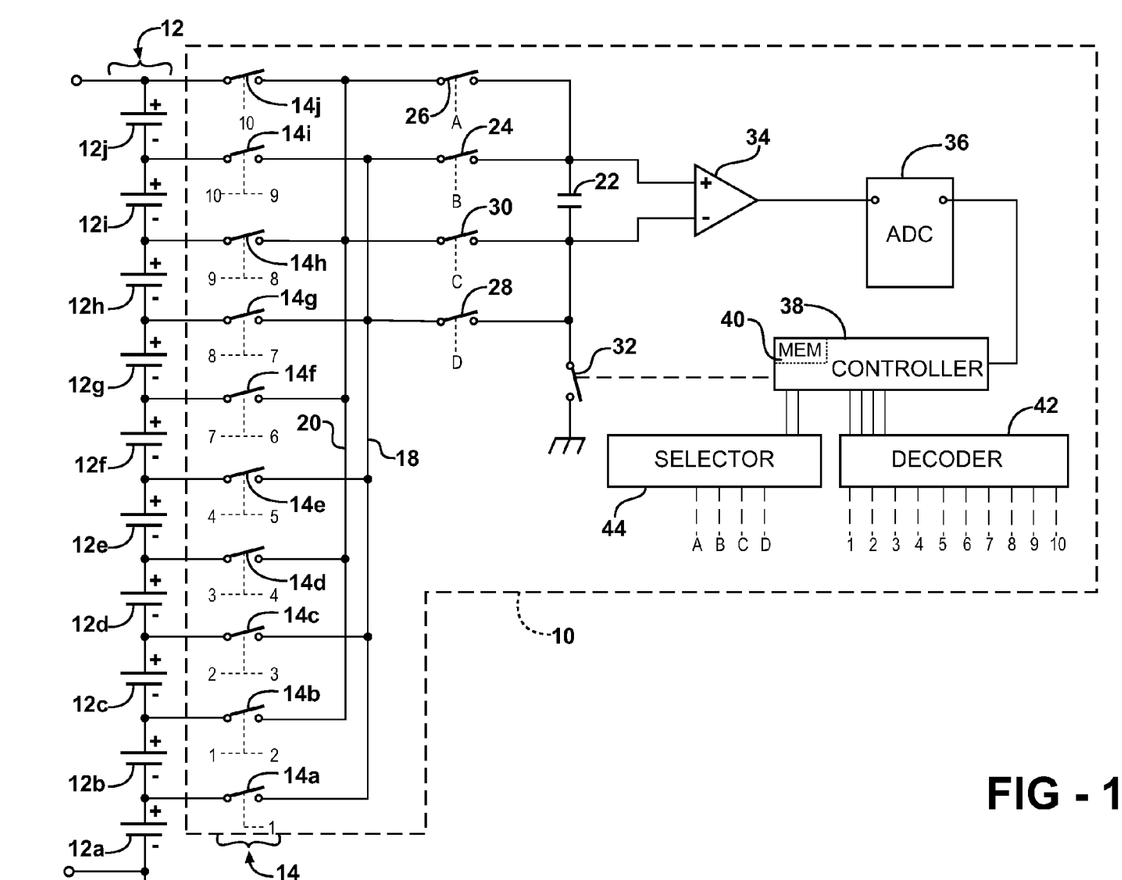
FIG. 1 is a block electrical schematic diagram of a preferred embodiment of the present invention showing a plurality of cells and a system for measuring a voltage of each individual cell.

Referring to FIG. 1, in a preferred embodiment of the invention, ten cells 12 are connected in series for providing power to an electrical device, such as, but not limited to, an electric vehicle (EV) or hybrid electric vehicle (HEV). Each cell is preferably a lithium cell with a charged voltage of about 4 volts (V), therefore providing a total voltage of about 40 V. Of course, any number, type, or capacity of cells 12 may be utilized with the subject invention, and the use of ten, lithium, 4 V cells 12 in the preferred embodiment should not be regarded as limiting. Furthermore, the plurality of cells 12 may be used in other applications outside of a vehicle. For purposes of descriptive clarity, the cells 12 are sequentially on the various Figures from the first cell 12A through a tenth cell 12J.

Each cell 12 includes a positive side (i.e., cathode) and a negative side (i.e., anode) as is known to those skilled in the art. The plurality of cells 12 are electrically connected together in series. That is, a positive side of the first cell 12A is electrically connected to a negative side of a second cell 12B, a positive side of the second cell 12B is electrically connected to a negative side of a third cell 12C, and so on. Typically, where the cells 12 are disposed in a vehicle, the negative side of the first cell 12A is electrically connected to a chassis ground, i.e., the metallic frame of the vehicle. However, there may be situations where the negative side of the first cell 12A is electrically isolated from the chassis ground.

Those skilled in the art appreciate that each cell 12 may actually be several physical cells 12 connected in parallel and operating at the same voltage level for increasing the current capacity of the entire plurality of cells 12 connected in series. Moreover, each cell 12 may actually be several physical cells connected in series.

The system 10 includes a plurality of cell switches 14. Each cell switch 14 has a first side (not numbered) and a second side (not numbered), such that electrons may flow between the sides when the cell switch 14 is activated. Conversely, electrons are generally prevented from flowing between the sides when the cell switch 14 is deactivated.

In the preferred embodiment, the cell switches 14 are implemented utilizing transistors, such that the electrical switching performed by the cell switches 14 can be done without moving parts (i.e., a "solid state" implementation). Most preferably, the cell switches 14 are implemented as a pair of metal oxide silicon field-effect transistors (MOSFETs). Each MOSFET in the pair are preferably a BSS84 P-channel type, which are available from numerous electronics manufacturers. The sources of each MOSFET of the pair are electrically connected together and the gates of each MOSFET are electrically connected together. The drain of one MOSFET acts as the first side of the cell switch 14 and the drain of the other MOSFET acts as the second side of the cell switch 14. The use of MOSFETs, instead of mechanical or relay type switches, greatly reduces implementation cost of the system 10 as well as increases the cycle speed of cell 12 measurement.

Those skilled in the art realize that each switch could alternatively be implemented with a single MOSFET, a different type of transistor(s), different types of field-effect transistors, a relay, or other suitable switching device. Furthermore, operation of the cell switches 14 (and other switches) herein may be referred to within this application as "opening", "opened", "closed", or "closing", etc., such as is the convention for mechanical type switches. However, this is done for convenience purposes only, and should not be read as limited the cell switches 14 (and other switches) to mechanical type switches.

Preferably, the number of cell switches 14 should equal the number of cells 12 to be measured. Therefore, in the preferred embodiment, where ten cells 12 are connected in series, ten cell switches 14 are utilized. For purposes of descriptive clarity, the ten cell switches 14 are labeled sequentially from a first cell switch 14A through a tenth cell switch 14I. The first side of each cell switch 14 is electrically connectable to a positive terminal of one of the cells 12.

Also for purposes of descriptive clarity, the first side of the first cell switch 14A is electrically connected to the positive side of the first cell 12A, the second side of the second cell switch 14B is electrically connected to the positive side of the second cell 12B, and so on. Since the cells 12 are electrically connected in series, the first side of the first cell switch 14A is electrically connected to both the positive side of the first cell 12A and the negative side of the second cell 12B. The same reasoning holds true for the other cell switches 14.

Figure 2:
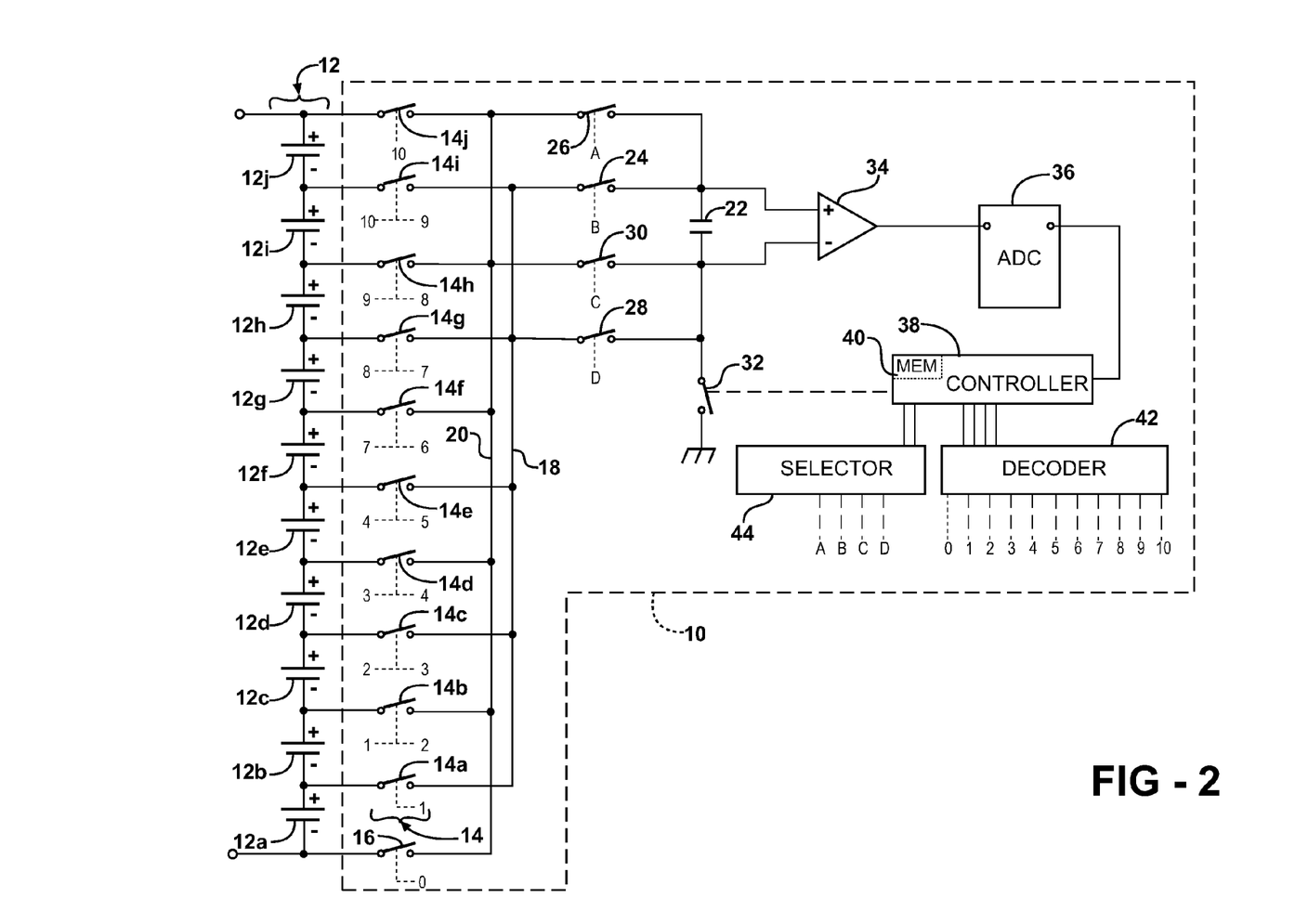
FIG. 2 is a block electrical schematic diagram of a first alternative embodiment of the present invention showing the system with an additional cell switch electrically connected to a negative side of a first cell.

In a first alternative embodiment, as shown in FIG. 2, an additional cell switch 16 is utilized. A first side of the additional cell is electrically connectable to a negative side of the first cell 12A. The functionality of the additional cell switch 16 is described in greater detail below.

The system 10 may also include a plurality of cell switch operation circuits (not shown). Each cell switch operation circuit is electrically connected to at least one cell switch 14 for activating the at least one cell switch 14. In the preferred embodiment, each cell switch operation circuit may operate a pair of cell switches 14.

Referring again to FIG. 1, the system 10 also includes a first bus 18 and a second bus 20. The first bus 18 is formed by electrical connection of every other cell switch 14, i.e., alternating cell switches 14. The second bus 20 is formed by electrical connection of every cell switch 14 not connected to the first bus 18. In the preferred embodiment, as shown in FIG. 1, the first bus 18 electrically connects the second side of the first, third, fifth, seventh, and ninth cell switches 14A, 14C, 14E, 14G, 14I. The second bus 20 electrically connects the second side of the second, fourth, sixth, eighth, and tenth cell switches 14B, 14D, 14F, 14H, 14J are electrically connected together. In the first alternative embodiment, shown in FIG. 2, the additional cell switch 16 is electrically connected to the second bus 20.

The system 10 includes a capacitor 22 for holding a charge corresponding to a voltage of one of the cells 12. The capacitor 22 includes a positive terminal and a negative terminal. In the preferred embodiment, the capacitor 22 has a capacitance of 1 µF (micro Farad). One acceptable capacitor 22 is the ECWU1105KCV, manufactured by Panasonic, and rated for 100 volts DC with a capacitance tolerance of ±10%. Of course, other capacitors 22, with varying capacitances and other physical and electrical characteristics, may also be acceptable. The capacitor 22 may be charged by each of the plurality of cells, as described in greater detail below. Therefore, the capacitor 22 is referred to by those skilled in the art as a "flying capacitor".

The system 10 further includes four bus switches 24, 26, 28, 30 for coordinating charging and isolating the capacitor 22. As with the cell switches 14, each of these bus switches 24, 26, 28, 30 has a first side and a second side. Furthermore, each bus switch 24, 26, 28, 30 is preferably implemented as a pair of MOSFETs, configured in the same fashion as the cell switches 14 described above.

The plurality of bus switches 24, 26, 28, 30 includes a first bus positive switch 24, a second bus positive switch 26, a first bus negative switch 28, and a second bus negative switch 30. The first sides of the first bus positive switch 24 and the first bus negative switch 28 are electrically connected to the first bus 18. The first sides of the second bus positive switch 26 and the second bus negative switch 30 are electrically connected to the second bus 20. The second sides of the first bus positive switch 24 and the second positive switch are electrically connected to the positive terminal of the capacitor 22. The second sides of the first bus negative switch 28 and the second bus negative switch 30 are electrically connected to the negative terminal of the capacitor 22.

The system 10 also includes a ground switch 32. One side of the ground switch 32 is electrically connected to the negative terminal of the capacitor 22 and the other side is electrically connected to ground. Where the system 10 is implemented in a vehicle, the ground is typically the chassis ground. In the preferred embodiment, the negative ground switch 32 is implemented as a BSS145-type MOSFET, however, other suitable MOSFETs may be used. The source of the MOSFET is electrically connected to ground and the drain is electrically connected to the negative terminal of the capacitor 22.

The system 10 preferably includes an amplifier 34 for amplifying the charge stored on the capacitor. In the preferred embodiment, the amplifier 34 is an operational amplifier (op-amp) 34. For purposes of convenience, the term op-amp 34 will be used hereafter in place of the term amplifier 34, however, this should not be read as limiting in any way. In the preferred embodiment, the op-amp 34 includes a non-inverting input, an inverting input, and an output. Specifically, the exemplary embodiment utilizes an amplified gain from each input to output of 1, otherwise referred to as a unity gain amplifier. One suitable op-amp 34 is an LT1636, available from Linear Technology Corporation of Milpitas, Calif. However, other suitable op-amps 34 or other types of amplifiers 34 may also be implemented.

The non-inverting input of the op-amp 34 is electrically connected to the positive terminal of the capacitor 12 and the inverting input of the op-amp 34 is electrically connected to the negative terminal of the capacitor 22. The op-amp 34 amplifies the voltage of the capacitor 22 and produces an amplified voltage signal. The amplified voltage signal is available at the output of the op-amp 34 and proportionally corresponds to the voltage of the capacitor 22, and also, the cell 12 that charged the capacitor 22.

The system 10 also includes an analog-to-digital converter (ADC) 36 electrically connected to the output of the op-amp 34 for converting an analog signal supplied by the op-amp 34 into digital data. In the preferred embodiment, the ADC 36 includes an input for receiving the analog signal and an output for producing a digital signal carrying the digital data. The ADC 36 of the preferred embodiment is an ADS7829IDRBR manufactured by Texas Instruments of Dallas, Tex. The digital signal of this ADC 36 has a 12-bit resolution and is presented serially at the output. The input of the ADC 36 is electrically connected to the output of the op-amp 34. The ADC 36 receives the amplified voltage signal at the input and produces the digital signal corresponding to the amplified voltage signal. Therefore, the digital data carried by the digital signal proportionally corresponds to the voltage of the capacitor 22 and the cell 12 that charged the capacitor 22.

The system 10 further includes a controller 38 for controlling operations of the various components of the system 10. The controller 38 may be a microprocessor, microcontroller, computer, application specific integrated circuit, or other similar device known to those skilled in the art. In the exemplary embodiment, the controller 48 is a model 68HC908GR32A microcontroller, manufactured by Freescale Semiconductor, headquartered in Austin, Tex. Of course, other controllers would also be suitable.

The controller 38 is in communication with the ADC 36 for receiving the digital data from the ADC 36. Specifically, in the preferred embodiment, the controller 38 includes a plurality of inputs and outputs. The plurality of inputs including a measurement input for receiving a digital signal. The measurement input is electrically connected to the output of the ADC 36, such that the digital data corresponding to the voltage of the capacitor 22 (and each cell 12) is received by the controller 38.

Figure 3:
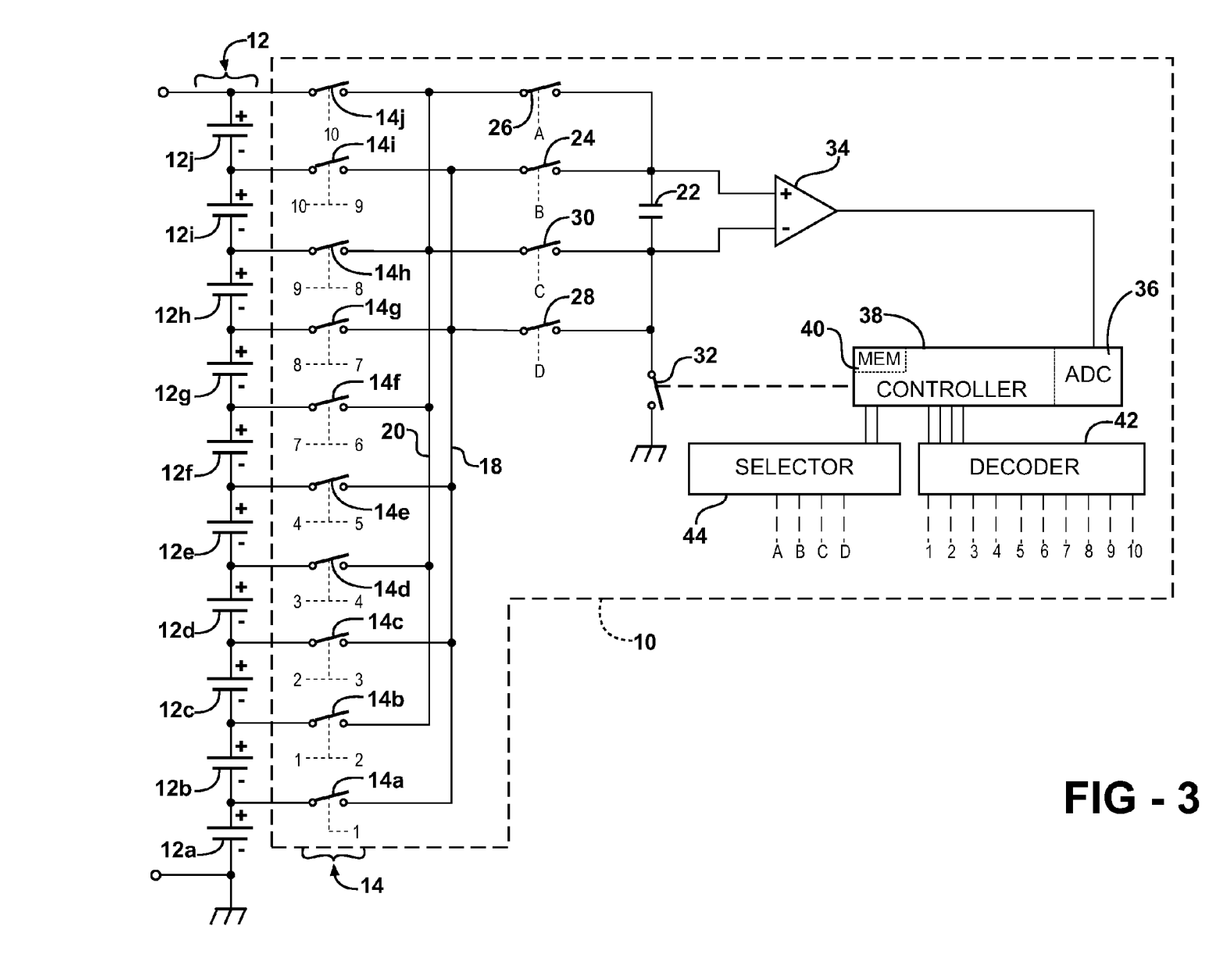
FIG. 3 is a block electrical schematic diagram of a second alternative embodiment of the present invention showing the system with an analog-to-digital converter integrated with a controller.

As is well known to those skilled in the art, many controllers have one or more internal ADCs. Therefore, in a second alternative embodiment, as shown in FIG. 3, the ADC 36 may be integrated within the controller 38. In the second alternative embodiment, therefore, the output of the op-amp 34 is electrically connected to the controller 38.

A memory 40 is in communication with the controller 38 for storing data. This data includes, but is not limited to, the digital data corresponding to the voltage of the each cell 12. The memory 40 may be random access memory (RAM), flash memory, a hard disk, a floppy disk, a compact disk, or any other memory device know by those skilled in the art. Furthermore, the memory 40 may be internal to the controller 38, as is the case with the illustrated embodiments.

In the preferred embodiment, the controller 38 is in communication with the switches 14, 24, 26, 28, 30, 32 for controlling the operation of the switches 14, 24, 26, 28, 30, 32. With respect to the cell switches 14, four outputs of the controller 38 are preferably electrically connected to a decoder 42. The decoder 42 is preferably a BCD (binary coded digit) to decimal decoder 42, such as a 74HC4028. The preferred decoder 42 includes four inputs electrically connected to the controller 38 and ten outputs (i.e., a first decoder output through a tenth decoder output). Only one output of the decoder 42 is activated based on the BCD provided by the controller 38 to the inputs of the decoder 42. Each of the ten outputs is electrically connected to one of the cell switch operation circuits to operate at least one cell switch 14. In the illustrated embodiments, the first decoder output operates the first cell switch 14A, a second decoder output operates the first and second cell switches 24, a third decoder output operates the second and third cell switches 24, and so on through the tenth decoder output, which operates the ninth and tenth cell switches 24.

In the illustrated embodiments, at least one output of the controller 38 is utilized to control the operation of the bus switches 24, 26, 28, 30. A selector 44 is implemented between the controller 38 and the bus switches 24, 26, 28, 30 to control the bus switches 34, 36, 38, 40. Furthermore, at least one output of the controller 38 is electrically connected to the ground switch 32 to control the operation of the ground switch 32.

The various components of the system 10 may be mounted on a printed circuit board (PCB), as is well known to those skilled in the art. The PCB is printed, on one or both sides, with a conductive material through a mask. The conductive material electrically connects the various components, such that extensive wiring between the components is not needed. Of course, various other electrical and electronic devices may be utilized in an implementation of the system 10, other than the devices described above. As is well known to those skilled in the art, these devices may include, but are not limited to, resistors, diodes, bipolar-junction transistors (BJTs), and capacitors.

Figure 4:
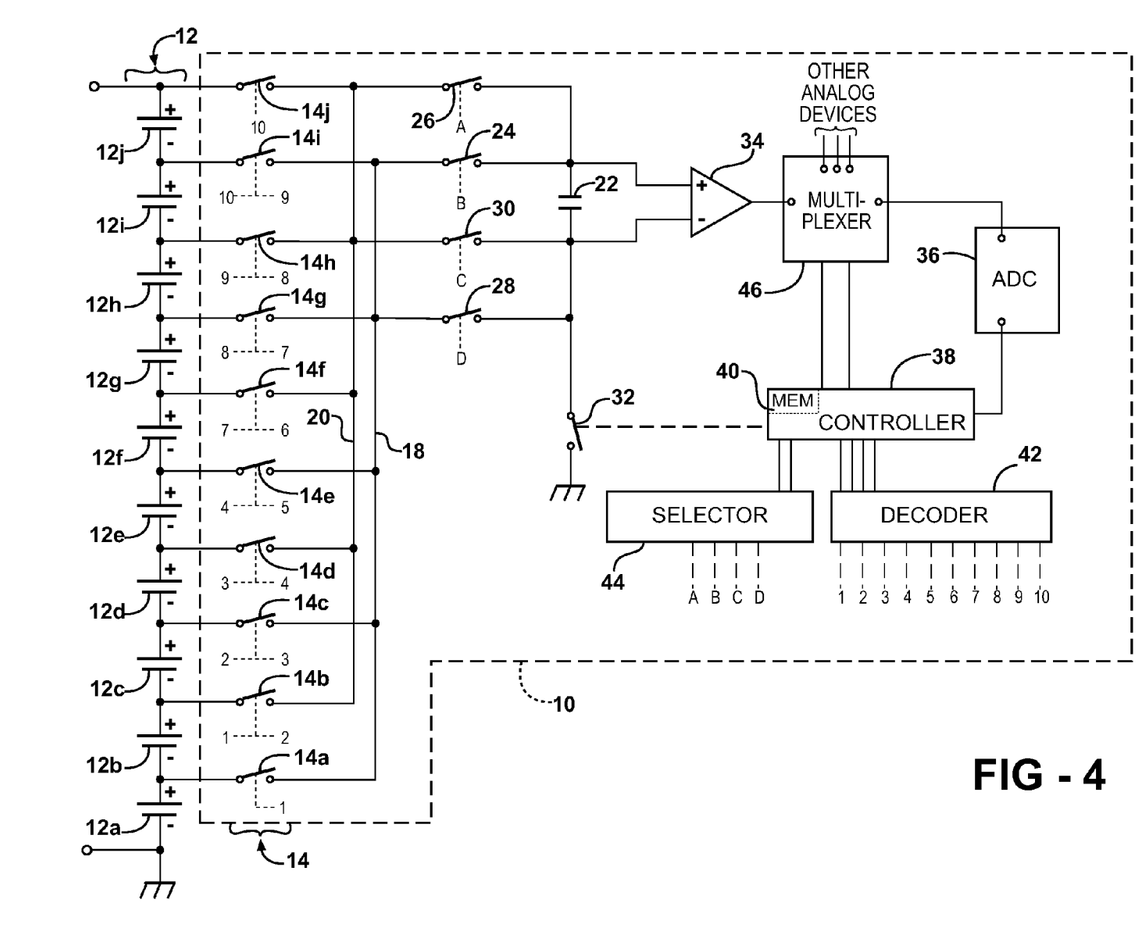
FIG. 4 is a block electrical schematic diagram of a third alternative embodiment of the present invention showing the system with a multiplexer electrically connected between an amplifier and the analog-to-digital converter.

Referring to FIG. 4, the system 10 may also include a multiplexer 46. Preferably, the multiplexer 46 includes a plurality of analog inputs, an analog output, and at least one selecting input. The multiplexer 46 receives a plurality of signals on the analog inputs and routes one of those signals to the analog output based on the state of the at least one selecting input. The analog output is electrically connected to the ADC 36 and one of the plurality of analog inputs is electrically connected to the op-amp 34, such that the amplified voltage signal may be routed to the ADC 36. The at least one selecting input is electrically connected to the controller 38. The remaining analog inputs are connected to various other analog devices, such as, but not limited to temperature sensors. Therefore, the single ADC 36 may be used to convert analog signals to digital data for a large number of devices.

The functionality and advantages of the system 10 described above may be better understood when examining a preferred operation of the system 10. A first step is to select one of the cells 12 for measurement. The controller 38, by operation of software, selects which cell 12 is to be measured. Typically, the software in the controller 38 will simply sequence through the cells 12 such that the voltage of each cell 12 is measured in turn. However, in certain situations, the controller 38 may deviate from such sequential operation to focus on a particular cell 12.

After selection of a cell 12, the controller 38 operates the various switches 14, 24, 26, 28, 30, 32, based on the selected cell 12, such that the positive terminal of the capacitor 22 is electrically connected to the positive side of the selected cell 12 and the negative terminal of the capacitor 22 is electrically connected to the negative side of the selected cell 12. The controller 38 utilizes the decoder 42 to operate the cell switch 14 or cell switches 14 corresponding to the selected cell 12.

The controller utilizes the selector 44 to operate the appropriate bus switches 24, 26, 28, 30.

For example, in the preferred embodiment, when determining a voltage of the first cell 12A, the capacitor 22 must be charged to the voltage of the first cell 12A. Therefore, the first cell switch 14A is closed, while the other cell switches 14B-14J are opened. Since, in the preferred embodiment, the negative side of the first cell 12A is grounded, the controller closes the ground switch 32. The first bus positive switch 24 and the second bus negative switch 30 are closed while the second bus positive switch 26 and the first bus negative switch 28 are open. Thus, the capacitor 22 will charge to the voltage level of the first cell 12A.

As further examples, when the second cell 12B is selected, the first and second cell switches 14A, 14B are closed, while the other cell switches 14C-14J are opened. The second bus positive switch 26 and the first bus negative switch 28 are closed while the first bus positive switch 24, the second bus negative switch 30, and the ground switch 32 are open. Thus, the capacitor 22 will charge to the voltage level of the second cell 12B. When the third cell 12C is selected, the second and third cell switches 14B, 14C are closed, while the other cell switches 14A, 14D-14J are opened. The first bus positive switch 24 and the second bus negative switch 30 are closed while the second bus positive switch 26, the first bus negative switch 28, and the ground switch 32 are open. Thus, the capacitor 22 will charge to the voltage level of the third cell 12C. Obviously, one skilled in the art may determine the appropriate switches 14 to open and close for each other cell 12 using a similar methodology.

Referring to FIG. 2, in the first alternative embodiment, the negative side of the first cell 12A is not electrically connected to ground. Therefore, in order to charge the capacitor 22 to the voltage of the first cell 12A, the additional cell switch 16 is utilized, instead of the ground switch 32, to electrically connect the negative side of the first cell 12A to the second bus 20 and the negative terminal of the capacitor 22.

After the capacitor 22 begins to charge, a predetermined time period must pass in order to allow a voltage level of the capacitor 22 to substantially match the voltage level of cell 12 that is being measured. The predetermined time is based on the electrical characteristics of the cell 12 and the capacitor 22 and is preferably tracked by the controller 38.

After the predetermined time period is passed, the switches 14, 24, 26, 28, 30, 32 are operated such that the capacitor 22 is electrically disconnected from the cells 12 and electrically connected to the input of the ADC 36. In the preferred embodiment 10, all of the cell switches 12 and the bus switches 24, 26, 28, 30 are opened. However, the ground switch 32 is closed such that the negative terminal of the capacitor 22 and the inverting input of the op-amp 24 are both grounded. The ADC 36 then receives the amplified voltage signal from the op-amp 34.

Next, the voltage of the capacitor 22 corresponding to the cell 12 being measured is read from the output of the ADC 36. Said another way, the controller 38 reads the digital output provided by the ADC 36 and extracts the digital data that corresponds to the voltage of the cell 12 that is being measured. In response to the controller 38 reading the voltage of the capacitor 22, the voltage, which corresponds to the voltage of the cell 22 being measured, is stored in the memory 40.

After the voltage of the capacitor is read and stored in the memory 40, the capacitor 22 may then be discharged. The capacitor is discharged by operating the bus switches 24, 26, 28, 30 and the ground switch 32 such that positive and negative terminals of the capacitor 22 are electrically connected to ground. Specifically, in the preferred embodiment, all four bus switches 24, 26, 28, 30 and the negative ground switch 32 are closed and all of the cell switches 14 are opened. Although discharging the capacitor 22 is not absolutely necessary for proper measurement of cell 12 voltage, it allows for detection of a disconnected cell 12 or an open-circuit within the system 10 in subsequent cell voltage measurements. Furthermore, this operation allows the system to discharge any capacitance that results between the busses 18, 20 as well as discharging the op-amp 34. It is important to note that the illustrated system 10 allows for grounding/discharging of both the capacitor 22 and the op-amp 34 simultaneously at the same chassis ground connection. Therefore, this discharging is done in a uniform matter. With this uniform discharging and proper layout of the circuit on the PCB, a more accurate reading of the next measured cell 12 may be achieved.

The system 10 may also include one or more resistive balancing circuits (not shown) for balancing the cells 12, i.e., adjusting the voltage of each cell 12 so that the voltage of each cell 12 is substantially similar. This adjustment of the cells 12 is preferably based on the voltage readings obtained for each cell 12 as described above.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A system for measuring voltage of individual cells in a plurality of cells connected in series, said system comprising:
   a plurality of cell switches for electrical connection to the plurality of cells wherein each cell switch includes a first side and a second side with said first side of each cell switch electrically connectable to a positive terminal one of the cells;
   a first bus electrically connected to said second side of every other cell switch;
   a second bus electrically connected to said second side of each cell switch not connected to said first bus;
   a first bus positive switch having a first side and a second side wherein said first side is electrically connected to said first bus;
   a second bus positive switch having a first side and a second side wherein said first side is electrically connected to said second bus;
   a first bus negative switch having a first side and a second side wherein said first side is electrically connected to said first bus;
   a second bus negative switch having a first side and a second side wherein said first side is electrically connected to said second bus;
   a capacitor for storing a charge of at least one of the cells wherein said capacitor includes a positive terminal electrically connected to said second sides of said first bus positive switch and said second bus positive switch and a negative terminal electrically connected to said second sides of said first bus negative switch and said second bus negative switch; and
   an amplifier for amplifying the charge stored on said capacitor wherein said amplifier includes an inverting input electrically connected to said negative terminal of said capacitor, a non-inverting input electrically connected to said positive terminal of said capacitor, and an output;
   a ground switch having a first side and a second side wherein said first side is electrically connected to said negative terminal of said capacitor and said second side is electrically connected to ground wherein when the capacitor has a charge stored thereon, the cell switches, bus switches, ground switch and capacitor are configured to provide the charge on the capacitor to the amplifier and then to discharge the capacitor to ground; and
   a controller for using the output of the amplifier to measure the voltage of individual cells and to detect a disconnected cell or open circuit within the system.

2. A system as set forth in claim 1 further comprising an analog-to-digital converter (ADC) electrically connected to said output of said amplifier for converting an analog signal supplied by said amplifier into digital data.

3. A system as set forth in claim 2 further comprising a controller in communication with said ADC for receiving the digital data from said ADC.

4. A system as set forth in claim 3 wherein said controller is in communication with said switches for controlling the operation of said switches.

5. A system as set forth in claim 3 wherein said ADC is integrated with said controller.

6. A system as set forth in claim 3 further comprising a multiplexer electrically connected between said amplifier and said ADC for allowing other analog signals to be converted by said ADC.

7. A system as set forth in claim 1 wherein each of said cell switches includes at least one transistor.

8. A system as set forth in claim 1 wherein each of said cell switches is further defined as a pair of MOSFETs wherein the sources of each MOSFET are electrically connected together and the gates of each MOSFET are electrically connected together.

9. A system as set forth in claim 1 wherein each of said bus switches includes at least one transistor.

10. A system as set forth in claim 1 wherein each of said bus switches is further defined as a pair of MOSFETs wherein the sources of each MOSFET are electrically connected together and the gates of each MOSFET are electrically connected together.

11. A system as set forth in claim 1 further comprising a controller for controlling operation of said switches.

12. A system as set forth in claim 11 further comprising a decoder electrically connected to said controller and said cell switches for receiving a signal from said controller and directing operation of said cell switches.

13. A system as set forth in claim 12 wherein said decoder includes a plurality of outputs wherein each of said outputs is electrically connected to a pair of cell switches for simultaneously controlling operation of said pair of cell switches.

14. A system for measuring voltage of individual cells in a plurality of cells connected in series, said system comprising:
   a plurality of cell switches for electrical connection to the plurality of cells wherein each cell switch includes a first side and a second side with said first side of each cell switch electrically connectable to a positive terminal one of the cells;
   a first bus electrically connected to said second side of every other cell switch;
   a second bus electrically connected to said second side of each cell switch not connected to said first bus;
   a first bus positive switch having a first side and a second side wherein said first side is electrically connected to said first bus;

a second bus positive switch having a first side and a second side wherein said first side is electrically connected to said second bus;

a first bus negative switch having a first side and a second side wherein said first side is electrically connected to said first bus;

a second bus negative switch having a first side and a second side wherein said first side is electrically connected to said second bus;

wherein each of said cell switches and said bus switches includes at least one transistor;

a capacitor for storing a charge of at least one of the cells wherein said capacitor includes a positive terminal electrically connected to said second sides of said first bus positive switch and said second bus positive switch and a negative terminal electrically connected to said second sides of said first bus negative switch and said second bus negative switch;

an amplifier for amplifying the charge stored on said capacitor wherein said amplifier includes an inverting input electrically connected to said negative terminal of said capacitor, a non-inverting input electrically connected to said positive terminal of said capacitor, and an output;

a ground switch having a first side and a second side wherein said first side is electrically connected to said negative terminal of said capacitor and said second side is electrically connected to ground wherein when the capacitor has a charge stored thereon, the cell switches, bus switches, ground switch and capacitor are configured to provide the charge on the capacitor to the amplifier and then to discharge the capacitor to ground;

an analog-to-digital converter (ADC) electrically connected to said output of said amplifier for converting an analog signal supplied by said amplifier into digital data; and a controller in communication with said ADC for receiving the digital data from said ADC and for using the output of the amplifier to measure the voltage of individual cells and to detect a disconnected cell or open circuit within the system.

* * * * *